(12) United States Patent  
Tsuchiya

(10) Patent No.: US 6,339,625 B1  
(45) Date of Patent: Jan. 15, 2002

(54) CLOCK GENERATION CIRCUIT

(75) Inventor: Masafumi Tsuchiya, Saitama (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/288,296

(22) Filed: Apr. 8, 1999

(30) Foreign Application Priority Data

Apr. 8, 1998 (JP) .......................................... 10-095796

(51) Int. Cl.$^7$ ................................................ H04L 7/00
(52) U.S. Cl. ....................................... 375/354; 375/357
(58) Field of Search .............................. 375/354, 357, 375/316, 356, 362, 373, 376; 331/2; 342/352, 356, 357.01, 357.06, 357.12; 701/213, 214, 215, 216; 713/400

(56) References Cited

U.S. PATENT DOCUMENTS

| | | | |
|---|---|---|---|
| 4,922,489 A | * 5/1990 | Ernst | 370/100.1 |
| 5,057,703 A | * 10/1991 | Sarkoezi | 327/292 |
| 5,291,528 A | * 3/1994 | Vermeer | 375/354 |
| 5,440,313 A | * 8/1995 | Osterdock et al. | 342/352 |
| 5,631,933 A | * 5/1997 | Chu et al. | 375/354 |
| 5,642,069 A | * 6/1997 | Waite | 327/292 |
| 5,748,569 A | * 5/1998 | Teodorescu et al. | 368/118 |
| 6,081,163 A | * 6/2000 | Ujiie et al. | 331/2 |

FOREIGN PATENT DOCUMENTS

| | | |
|---|---|---|
| JP | 3-201822 | 9/1991 |
| JP | 8-172380 | 7/1996 |

\* cited by examiner

*Primary Examiner*—Stephen Chin  
*Assistant Examiner*—Chieh M. Fan  
(74) *Attorney, Agent, or Firm*—Foley & Lardner

(57) ABSTRACT

In a system in which active and standby units, each used to control a VCXO on the basis of a reference signal from a GPS receiver to generate a high-precision clock, constitute a redundant arrangement, and a clock is output from the active unit, a clock generating circuit has an arrangement in which when the active unit cannot receive any reference signal from the GPS receiver for some reason, free-running operation is performed in the control state the VCXO assumed when the reference signal stopped in the internal circuit of the active unit, and switching to the standby unit is not immediately performed, and an arrangement in which when the standby unit can normally receive the reference signal from the GPS, the output clock from the active unit during free-running operation is monitored, and the unit that is to receive the reference signal is switched from the active unit to the standby unit at the timing at which no influence is exerted on the output clock when a phase difference larger than a predetermined value is detected between the output clock and the reference signal from the GPS receiver of the standby unit, thereby preventing a clock exceeding the phase difference allowed in the system from being supplied to another circuit.

6 Claims, 3 Drawing Sheets

CLOCK GENERATION CIRCUIT

BACKGROUND OF THE INVENTION

1. Field of the Invention

The present invention relates to a clock generation circuit and, more particularly, to a clock generation circuit that is used in a base station apparatus in a mobile communication system to generate a clock on the basis of a pulse signal from a GPS (Global Positioning System).

2. Description of the Prior Art

A system that detects its own position by using a GPS (Global Positioning System) has been available. This GPS transmits a pulse signal having an accurate period of, e.g., 1 pulse/sec. Some base station devices in a mobile communication system use a clock generation circuit for receiving a pulse signal from the GPS through a GPS receiver and generating an accurate clock on the basis of a reference signal output from the GPS receiver.

Such a clock generation circuit often incorporates redundant clock generation units to improve the reliability. More specifically, the clock generation circuit includes an active unit in use and a standby unit as an auxiliary unit having the same arrangement as that of the active unit.

Such a conventional clock generation circuit having this redundant arrangement has the function of performing free-running operation upon detecting that the GPS receiver of the active unit has stopped outputting a reference signal. In this free-running operation, a clock is internally generated and output without using any pulse signal from the GPS. This function is provided because the levels of pulse signals input to the GPS receiver vary depending on the installation conditions for the GPS antenna and the like, and the GPS receiver may stop outputting a reference signal when the signal level drops to too low a level.

In the prior art, even when such free-running operation is activated, the clock generation unit to be used is not autonomously switched from the active unit to the standby unit, but is switched from the active unit to the standby unit by the operator regardless of the presence/absence of a reference signal from the standby unit.

The following problems are, however, posed in the prior art described above.

The accuracy of the clock internally generated in the standby unit during free-running operation is limited, and the phase shift between the clock generated in the free-running operation and the accurate clock gradually increases. The first problem is that a clock which exceeds a phase difference allowed in other circuits, e.g., the transmitter and the receiver, which use a clock from the clock generation circuit may be supplied because of the phase shift of the output clock produced in the free-running operation. Such a problem arises because this circuit has no means for autonomously switching to the standby unit in spite of the fact that the standby unit has a normal reference signal.

The second problem is that switching from the active unit to the standby unit may affect the output clock depending on the operation performed by the operator. This is because when the operator externally inputs a switching signal to the active unit, asynchronous switching occurs between the active unit and the standby unit because the reference signal for generating a switching timing has stopped.

SUMMARY OF THE INVENTION

The present invention has been made in consideration of the above points, and has as its object to provide a clock generation circuit having redundant clock generation units, in which switching from an active unit to a standby unit can be autonomously and synchronously performed.

In order to achieve the above object, according to one aspect of the present invention, in a system in which active and standby units, each used to control a VCXO on the basis of a reference signal from a GPS receiver to generate a high-precision clock, constitute a redundant arrangement, and a clock is output from the active unit, there is provided a clock generating circuit having an arrangement in which when the active unit cannot receive any reference signal from the GPS receiver for some reason, free-running operation is performed in the control state the VCXO assumed when the reference signal stopped in the internal circuit of the active unit, and switching to the standby unit is not immediately performed, and an arrangement in which when the standby unit can normally receive the reference signal from the GPS, the output clock from the active unit during free-running operation is monitored, and the unit that is to receive the reference signal is switched from the active unit to the standby unit at the timing at which no influence is exerted on the output clock when a phase difference larger than a predetermined value is detected between the output clock and the reference signal from the GPS receiver of the standby unit, thereby preventing a clock exceeding the phase difference allowed in the system from being supplied to another circuit.

According to the present invention, a clock exceeding the phase difference allowed in another circuit that uses the clock generated by the clock generation circuit is never supplied. This is because any phase difference between the reference signal from the GPS receiver of the standby unit and the clock generated from the active unit is measured, and the unit from which the reference signal is to be acquired is autonomously switched from the active unit to the standby unit at the timing at which no influence is exerted on the output clock in accordance with a predetermined phase difference smaller than the allowable phase difference.

In addition, according to the present invention, unit replacement can be performed for the maintenance of the active unit or GPS antenna by forcibly switching from the active unit to the standby unit.

The above and many other objects, features and advantages of the present invention will become manifest to those skilled in the art upon making reference to the following detailed description and accompanying drawings in which preferred embodiments incorporating the principle of the present invention are shown by way of illustrative examples.

DETAILED DESCRIPTION OF THE PREFERRED EMBODIMENTS

A few preferred embodiments of the present invention will be described below with reference to the accompanying drawings.

Figure 1:
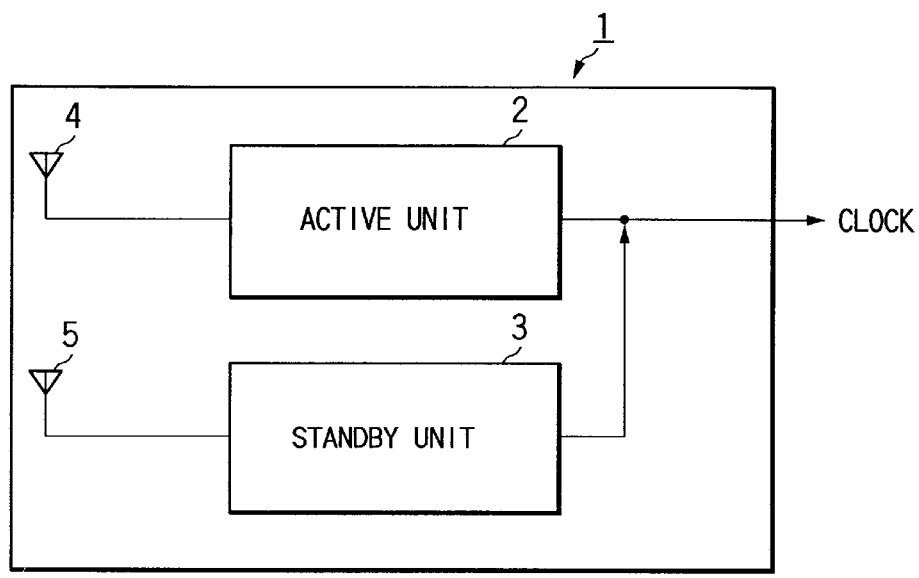
FIG. 1 is a block diagram showing the schematic arrangement of an embodiment of the present invention.

FIG. 1 is a block diagram showing the schematic arrangement of a clock generation circuit according to an embodiment of the present invention.

As shown in FIG. 1, a clock generation circuit 1 is comprised of an active unit 2, a standby unit 3, and GPS antennas 4 and 5. The active unit 2, the standby unit 3, and the GPS antennas 4 and 5 constitute redundant arrangements, i.e., identical arrangements. In normal operation, the active unit 2 outputs a clock, but the standby unit 3 stops outputting a clock although the standby unit 3 generates the clock in the same manner as the active unit 2.

Figure 2:
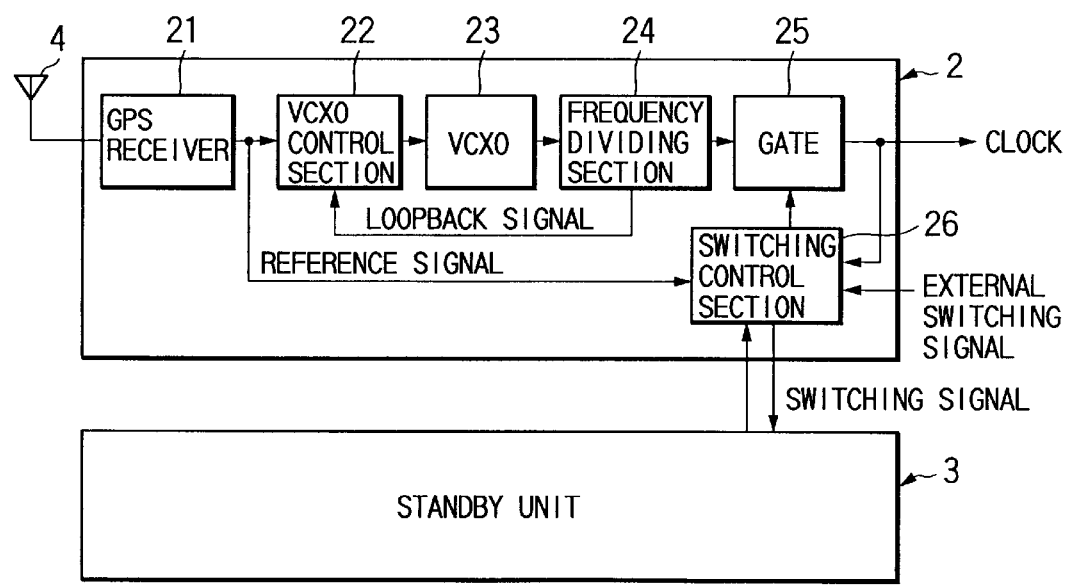
FIG. 2 is a block diagram showing the arrangement of part of an active unit in the embodiment in FIG. 1.

FIG. 2 is a block diagram showing the internal arrangement of the active unit 2 in FIG. 1.

Since the internal arrangement of the standby unit 3 in FIG. 1 is the same as that of the active unit 2, an illustration thereof is omitted in FIG. 2.

As shown in FIG. 2, the active unit 2 is comprised of a GPS receiver 21 for receiving a pulse signal from a GPS through the GPS antenna 4, a VCXO (Voltage Controlled Crystal Oscillator) control section 22 for controlling a VCXO 23 on the basis of a reference signal from the GPS receiver 21, the VCXO 23 that is controlled by the VCXO control section 22 to output a signal having a predetermined frequency, a frequency dividing section 24 for frequency-dividing a signal from the VCXO 23 by a predetermined frequency division ratio, a gate 25 for outputting a clock having undergone frequency division with the predetermined frequency division ratio in the frequency dividing section 24, and a switching control section 26 for instructing the gate 25 to output or not to output a clock.

In this embodiment, when the GPS receiver 21 of the active unit 2 stops outputting the reference signal, and the VCXO control section 22 controls the VCXO 23 to generate a clock in free-running operation, the GPS receiver of the standby unit 3 can properly output a reference signal. In addition, when the phase difference between the reference signal and the output clock from the active unit 2, which is measured by the switching control section of the standby unit 3, is equal to or more than a predetermined value, autonomous switching from the active unit to the standby unit is performed.

This circuit also has the function of forcibly switching the active and standby units by inputting an external switching signal to the standby unit 3.

This embodiment will be described in more detail below with reference to FIG. 2.

In the active unit 2, upon receiving a pulse signal from the GPS through the GPS antenna 4, the GPS receiver 21 generates a reference signal and outputs it to the VCXO control section 22 and the switching control section 26.

The VCXO control section 22 has the function of comparing the phase of the reference signal from the GPS receiver 21 with the phase of the loopback signal obtained by frequency-dividing the output from the VCXO 23 to have the same frequency as that of the reference signal in the frequency dividing section 24, and controlling the frequency control voltage of the VCXO 23 to lock these signals in phase if there is a phase shift. The VCXO control section 22 also has the function of detecting that the reference signal has stopped, and holding the frequency control voltage.

The VCXO 23 outputs a signal having a predetermined frequency upon reception of the frequency control voltage from the VCXO control section 22. The frequency dividing section 24 generates the loopback signal and a clock required for another unit outside the clock generation circuit 1 from the output signal from the VCXO 23. The gate 25 outputs the generated clock from the active unit 2 to the outside.

The switching control section 26 has the function of controlling the output of the gate 25 and the autonomous switching function of measuring any phase difference between the reference signal from the GPS receiver 21 and the generated output clock, and inactivating the other system (standby unit 3) while activating the self-system (active unit 2) if the phase difference is equal to or more than a predetermined value. The switching control section 26 also has the function of forcibly switching the active and standby units by inputting an external switching signal to the standby unit 3.

Since the standby unit 3 has the same arrangement as that of the active unit 2, a description thereof will be omitted.

The operation of this embodiment will be described next.

Figure 3:
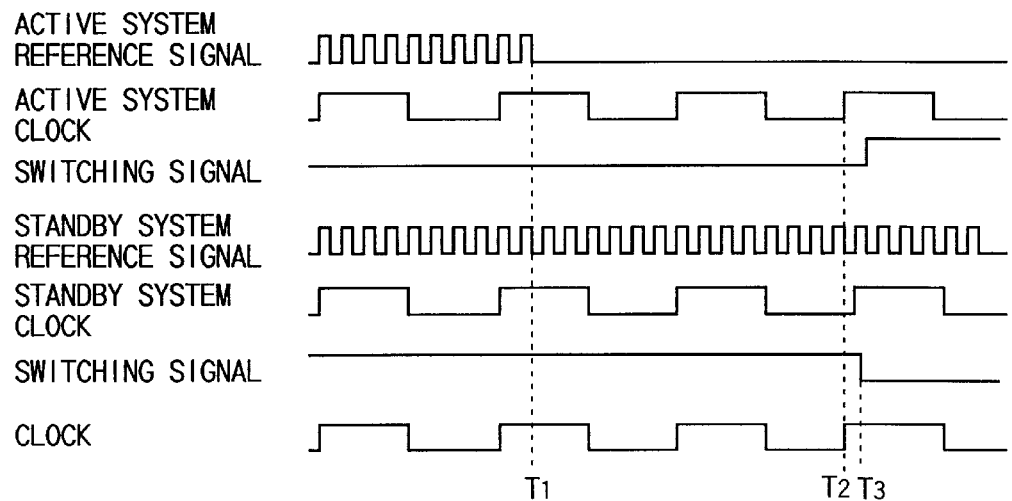
FIG. 3 is a timing chart showing the operation of the active unit in FIG. 2.

FIG. 3 is a timing chart showing the operation of the embodiment shown in FIG. 2.

Referring to FIG. 3, in normal operation, the active unit 2 and the standby unit 3 receive reference signals which are in phase inside the units, and the active unit 2 supplies a clock to another circuit that uses the clock. If the reference signal stops at time T1 for some reason, e.g., a GPS antenna 4 or GPS receiver 21 failure, the VCXO control section 22 stops comparing the reference signal with the loopback signal upon detecting that the reference signal has stopped, and starts free-running operation while maintaining the control voltage for the VCXO 23, which was generated when the reference signal stopped.

Free-running operation is performed because the levels of signals input to the GPS receiver 21 vary depending on the installation conditions for the GPS antenna 4, and the GPS receiver may stop outputting the reference signal when the signal level drops to a weak level.

When the GPS antenna 5 and GPS receiver of the standby unit 3 normally operate, and the reference signal is normally output, the switching control section of the standby unit 3 can measure any phase difference between the reference signal from the GPS receiver and the clock output from the active unit 2. Referring to FIG. 2, it looks as if only the clock from the gate 25 of the active unit 2 is input to the switching control section 26 of the active unit 2. As shown in FIG. 1, however, since the clock lines from the two units are connected to each other, only the clock from the standby unit 3 is present on the clock lines while the gate 25 of the active unit 2 stops outputting. As a result, the switching control section 26 of the active unit 2 can obtain the clock output from the standby unit 3. Similarly, the switching control section of the standby unit 3 can obtain the clock output from the active unit 2.

The phase of the clock from the active unit 2 in free-running operation gradually shifts from the reference signal with variations in the output frequency of the VCXO 23. If the phase shift exceeds the predetermined value at time T2, the switching control section of the standby unit 3 outputs a switching signal to the switching control section 26 of the active unit 2 at time T3 at which no influence is exerted on the output clock.

Upon reception of the switching signal, the switching control section 26 of the active unit 2 instructs the gate 25 to stop outputting and performs control to set the active unit 2 in the standby state.

Upon transmitting the switching signal to the switching control section 26 of the active unit 2, the switching control section of the standby unit 3 instructs the gate of the standby unit 3 to cancel the output stopped state so as to set the standby unit 3 in the active state.

Figure 4:
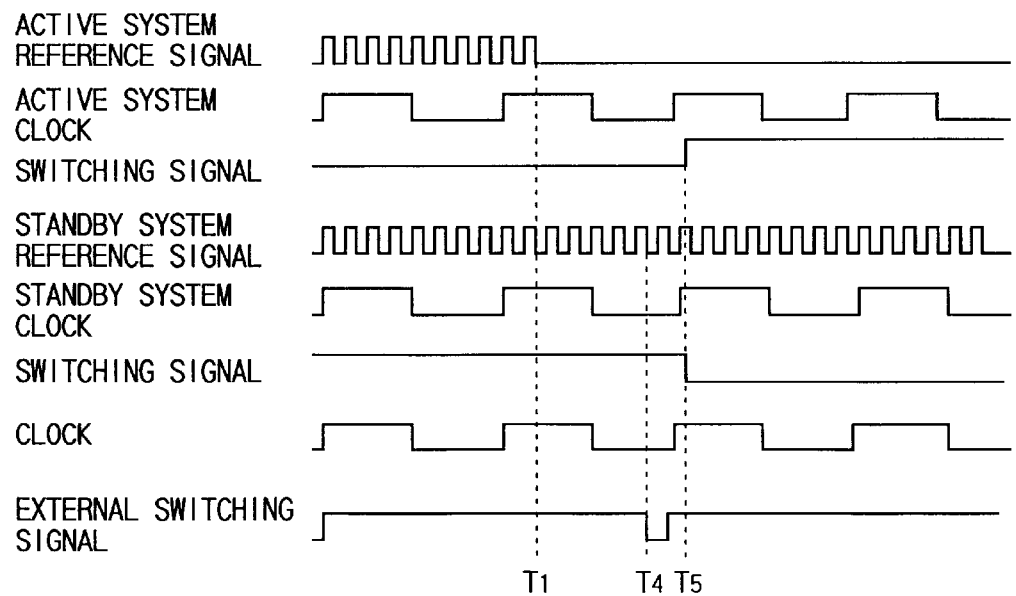
FIG. 4 is a timing chart showing switching operation performed by an operator in the active unit in FIG. 2.

FIG. 4 is a timing chart showing the switching operation performed by the operator in the embodiment shown in FIG. 2.

Referring to FIG. 2, the switching control section 26 receives an external switching signal as a means for allowing external switching control (e.g., a switching pulse from a push button or remote system). By inputting this external switching signal to the standby unit, the active and standby unit s can be switched at the timing at which no influence is exerted on the output clock. Referring to FIG. 4, the operator determines that the reference signal from the active unit s topped at time T1, and inputs an external switching signal at time T4. At time T5, the standby unit executes switching operation at the timing at which no influence is inflicted on the output clock.

Another embodiment of the present invention will be described in detail next with reference to FIG. 5.

Figure 5:
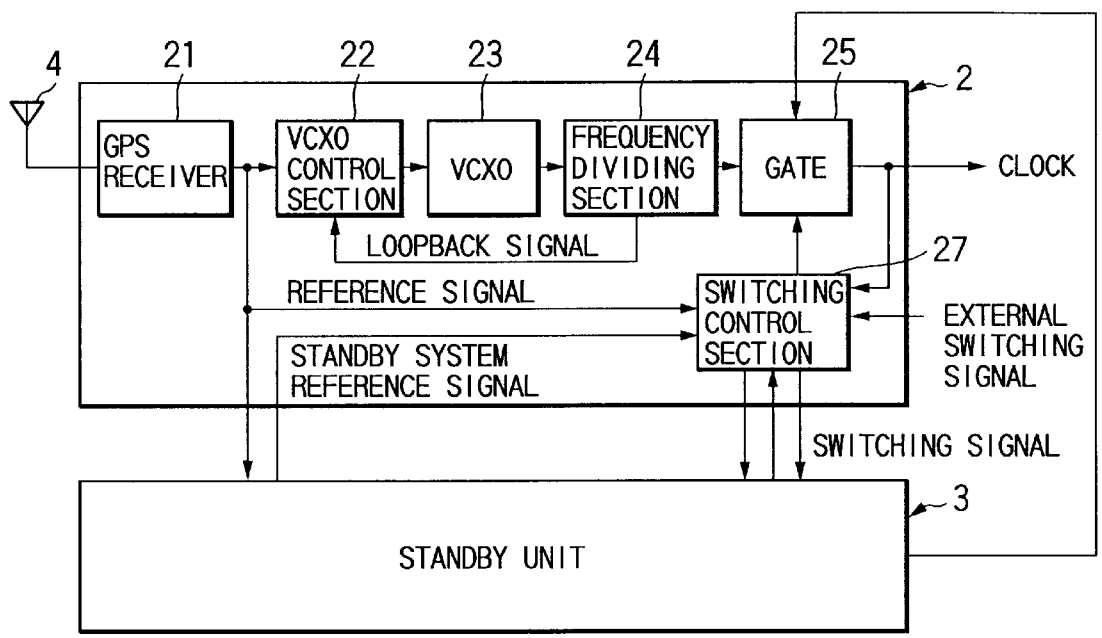
FIG. 5 is a block diagram showing the internal arrangement of another example of the active unit.

FIG. 5 is a block diagram showing the internal arrangement of an active unit 2 in an embodiment different from the embodiment in FIG. 2.

Since the internal arrangement of a standby unit 3 is the same as that of the active unit 2, an illustration thereof is omitted in FIG. 5.

Referring to FIG. 5, a reference signal from a GPS receiver 21 of the active unit 2 is input to the switching control section of the standby unit 3, and a reference signal from the GPS receiver of the standby unit 3 is input to a switching control section 27 of the active unit 2. The switching control section 27 of the active unit 2 can instruct the gate of the standby unit 3 to cancel the output stopped state, and the switching control section of the standby unit 3 can instruct a gate 25 of the active unit 2 to cancel the output stopped state.

With this arrangement, the active and standby states of the active unit 2 can be switched at the timing at which no influence is exerted on the output clock.

In this embodiment, when a failure occurs in the switching control section of the standby unit 3, the switching control section 27 of the active unit 2 can switch the active and standby states.

In normal operation, the active unit 2 and the standby unit 3 receive reference signals which are in phase inside the units, and the active unit 2 supplies a clock to another circuit that uses the clock. If the reference signal stops for some reason, e.g., a GPS antenna 4 or GPS receiver 21 failure, a VCXO control section 22 stops comparing the reference signal with the loopback signal upon detecting that the reference signal has stopped, and starts free-running operation while maintaining the control voltage for a VCXO 23 at that time.

When a GPS antenna 5 and GPS receiver of the standby unit 3 normally operate, and the reference signal is normally output, the switching control section 27 of the standby unit 2 measures any phase difference between the reference signal from the GPS receiver and the clock output from the active unit 2.

The phase of the clock from the active unit 2 in free-running operation gradually shifts from the reference signal with variations in the output frequency of the VCXO 23. If the phase shift exceeds the predetermined value, the switching control section 27 of the standby unit 2 instructs the gate 25 to stop outputting and performs control to set the active unit 2 in the standby state. In addition, the switching control section 27 of the active unit 2 instructs the gate of the standby unit 3 to cancel the output stopped state and performs control to set the standby unit 3 in the active state.

Each embodiment described above uses a VCOX. Obviously, however, the present invention is not limited to this and can be applied to cases in which other types of VCOs (Voltage Control Oscillators) are used.

What is claimed is:

1. A clock generation circuit comprising:
    a first GPS receiver for receiving a pulse signal from a GPS and outputting a first reference signal based on the pulse signal;
    a first voltage controlled oscillator for outputting a first signal on the basis of a first input voltage;
    a first frequency dividing section for frequency-dividing an output signal from said first voltage controlled oscillator to have a first predetermined frequency, and outputting the signal as a first clock;
    a first voltage controlled oscillator control section for controlling the first input voltage to said first voltage controlled oscillator on the basis of the first reference signal from said first GPS receiver and the first clock from said first frequency dividing section;
    a first gate for receiving the first clock from said first frequency dividing section and outputting the first clock;
    a first switching control section for instructing said first gate to output or not to output the first clock from said first frequency dividing section;
    a second GPS receiver for receiving the pulse signal from the GPS and outputting a second reference signal based on the pulse signal;
    a second voltage controlled oscillator for outputting a second signal on the basis of a second input voltage;
    a second frequency dividing section for frequency-dividing an output signal from said second voltage controlled oscillator to have a second predetermined frequency, and outputting the signal as a second clock;
    a second voltage controlled oscillator control section for controlling the second input voltage to said second voltage controlled oscillator on the basis of the second reference signal from said second GPS receiver and the second clock from said second frequency dividing section;
    a second gate for receiving the second clock from said second frequency dividing section and outputting the second clock;
    a second switching control section for instructing said second gate to output or not to output the second clock from said second frequency dividing section; and
    control means for setting said first gate in an output state and setting said second gate in a blocking state in normal operation,
    wherein upon detecting that the first reference signal from said first GPS receiver has stopped, said first voltage controlled oscillator control section allows free-running operation by maintaining the input voltage to said first voltage controlled oscillator which has been used before the first reference signal stopped,
    when a phase difference between the second reference signal from said second GPS receiver and the first clock from said first gate becomes greater than or equal to a predetermined value, said second switching control section outputs a switching signal to said first switching control section and sets said second gate in an output state, and said first switching control section sets said first gate in a blocking state upon reception of the switching signal.

2. A circuit according to claim 1, wherein said first and second voltage controlled oscillators are voltage controlled crystal oscillator.

3. A clock generation circuit comprising:

a first GPS receiver for receiving a pulse signal from a GPS and outputting a first reference signal based on the pulse signal;

a first voltage controlled oscillator for outputting a first signal on the basis of a first input voltage;

a first frequency dividing section for frequency-dividing an output signal from said first voltage controlled oscillator to have a first predetermined frequency, and outputting the signal as a first clock;

a first voltage controlled oscillator control section for controlling the first input voltage to said first voltage controlled oscillator on the basis of the first reference signal from said first GPS receiver and the first clock from said first frequency dividing section;

a first gate for receiving the first clock from said first frequency dividing section and outputting the first clock;

a first switching control section for instructing said first gate to output or not to output the first clock from said first frequency dividing section;

a second GPS receiver for receiving the pulse signal from the GPS and outputting a second reference signal based on the pulse signal;

a second voltage controlled oscillator for outputting a second signal on the basis of a second input voltage;

a second frequency dividing section for frequency-dividing an output signal from said second voltage controlled oscillator to have a second predetermined frequency, and outputting the signal as a second clock;

a second voltage controlled oscillator control section for controlling an input voltage to said second voltage controlled oscillator on the basis of the second reference signal from said second GPS receiver and the second clock from said second frequency dividing section;

a second gate for receiving the second clock from said second frequency dividing section and outputting the second clock;

a second switching control section for instructing said second gate to output or not to output the second clock from said second frequency dividing section; and control means for setting said first gate in an output state and setting said second gate in a blocking state in normal operation, wherein upon detecting that the first reference signal from said first GPS receiver has stopped, said first voltage controlled oscillator control section allows free-running operation by maintaining the first input voltage to said first voltage controlled oscillator which has been used before the first reference signal stopped, and when a phase difference between the second reference signal from said second GPS receiver and the first clock from said first gate becomes greater than or equal to a predetermined value, said first switching control section outputs a switching signal to said first switching control section and sets said second gate in an output state.

4. A circuit according to claim 3, wherein said first and second voltage controlled oscillators are voltage controlled crystal oscillators.

5. A clock generation circuit for generating a clock on the basis of an externally supplied reference signal, comprising:

redundant reference signal acquisition means for obtaining the reference signal and including a primary and secondary acquisition units, wherein one of said primary and secondary acquisition units is in a standby state and the other is in use;

switching means for, when no reference signal can be obtained by said reference signal acquisition means in use, switching to said reference signal acquisition means in said standby state to obtain the reference signal;

free-running operation means for internally generating a clock when no reference signal can be obtained by said reference signal acquisition means in use; and control means for, when no reference signal can be obtained by said reference signal acquisition means in use, causing said free-running operation means to generate the clock, and when a phase difference between the reference signal and the clock generated by said free-running operation means becomes greater than or equal to a predetermined value, causing said switching means to switch the reference signal acquisition means in use to said reference signal acquisition means in the standby state.

6. A reference signal acquisition switching method for a clock generation circuit comprising the steps of:

generating a clock on the basis of an externally supplied reference signal;

utilizing redundant reference signal acquisition circuits for obtaining the reference signal, wherein said redundant reference signal acquisition circuits include a reference signal acquisition circuit in use and a reference signal acquisition circuit in a standby state;

switching to said reference signal acquisition circuit in the standby state in synchronism with the clock when no reference signal can be obtained by said reference signal acquisition circuit in use to obtain the reference signal; and internally generating a clock by free-running operation when no reference signal can be obtained by said reference signal acquisition circuit in use, and switching said reference signal acquisition circuit in use to said reference signal acquisition circuit in the standby state when a phase difference between the reference signal and the clock generated by the free-running operation becomes greater than or equal to a predetermined value.

* * * * *